(12) United States Patent
Lee et al.

(10) Patent No.: US 8,058,128 B2
(45) Date of Patent: Nov. 15, 2011

(54) METHODS OF FABRICATING RECESSED CHANNEL METAL OXIDE SEMICONDUCTOR (MOS) TRANSISTORS

(75) Inventors: Keum-Joo Lee, Hwaseong-si (KR); Bo-Wo Choi, Seoul (KR); In-Seak Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/754,244

(22) Filed: Apr. 5, 2010

(65) Prior Publication Data

US 2010/0255649 A1   Oct. 7, 2010

(30) Foreign Application Priority Data

Apr. 6, 2009  (KR) .................. 10-2009-0029586

(51) Int. Cl.
*H01L 21/336* (2006.01)
(52) U.S. Cl. .................. 438/270; 438/589; 257/E21.19; 257/E21.41
(58) Field of Classification Search .................. 438/270, 438/589; 257/E21.19, E21.41
See application file for complete search history.

(56) References Cited

U.S. PATENT DOCUMENTS

| | | | |
|---|---|---|---|
| 6,291,310 B1 * | 9/2001 | Madson et al. | 438/424 |
| 2001/0023960 A1 * | 9/2001 | Soga et al. | 257/330 |
| 2007/0148979 A1 | 6/2007 | Lee et al. | |
| 2008/0003791 A1 | 1/2008 | Cho et al. | |
| 2008/0254639 A1 * | 10/2008 | Graff | 438/725 |
| 2009/0176342 A1 * | 7/2009 | Lee et al. | 438/270 |

FOREIGN PATENT DOCUMENTS

| | | |
|---|---|---|
| JP | 2004-140039 | 5/2004 |
| JP | 2008-016838 | 1/2008 |
| KR | 100695500 B1 | 3/2007 |
| KR | 1020080001881 A | 1/2008 |

* cited by examiner

*Primary Examiner* — Alexander Ghyka
*Assistant Examiner* — Stanetta Isaac
(74) *Attorney, Agent, or Firm* — Myers Bigel Sibley & Sajovec, P.A.

(57) ABSTRACT

A method of fabricating a semiconductor device includes forming a mask pattern on an active region of a substrate defined by an isolation region. The mask pattern includes an opening therein exposing a portion of the active region. The exposed portion of the active region is etched to define a preliminary gate trench therein including opposing sidewalls and a surface therebetween, where portions of the mask pattern extend to edges of the active region outside the preliminary gate trench. An annealing process is performed on the substrate to form a gate trench from the preliminary gate trench, and gate electrode is formed in the gate trench. The preliminary gate trench and the gate trench have a substantially similar width defined between the edges of the active region including the portions of the mask pattern thereon.

18 Claims, 12 Drawing Sheets

METHODS OF FABRICATING RECESSED CHANNEL METAL OXIDE SEMICONDUCTOR (MOS) TRANSISTORS

CROSS-REFERENCE TO RELATED APPLICATION

This application claims priority under 35 U.S.C. §119 from Korean Patent Application No. 10-2009-0029586, filed on Apr. 6, 2009, the contents of which are hereby incorporated herein by reference in its entirety.

BACKGROUND

Example embodiments relate to methods of fabricating integrated circuit devices.

Integrated circuit devices may include discrete devices such as transistors. To meet increasing demands for device integration, it may be desirable for the size of transistor gates to be reduced.

SUMMARY

Example embodiments provide methods of fabricating semiconductor devices capable of reducing and/or preventing sharp silicon residue from remaining on edges of a gate trench.

According to some embodiments, in a method of fabricating a semiconductor device, a mask pattern is formed on an active region of a substrate defined by an isolation region. The mask pattern includes an opening therein exposing a portion of the active region. The exposed portion of the active region is etched to define a preliminary gate trench therein including opposing sidewalls and a surface therebetween, where portions of the mask pattern extend to edges of the active region outside the preliminary gate trench. An annealing process is performed on the substrate to form a gate trench from the preliminary gate trench, and gate electrode is formed in the gate trench. The preliminary gate trench and the gate trench have a substantially similar width defined between the edges of the active region including the portions of the mask pattern thereon. Accordingly, the portions of the mask pattern extending to the edges of the active region prevent significant widening thereof during the annealing process.

In some embodiments, prior to performing the annealing process, a cleaning process may be performed on the substrate including the preliminary gate trench therein. The cleaning process may reduce a thickness of the mask pattern without substantially increasing a width of the opening therein to define the portions of the mask pattern extending to the edges of the active region outside the preliminary gate trench. For example, the portions of the mask pattern that remain after the cleaning process may have a thickness of about 1 Å or more, and in some embodiments, the portions of the mask pattern that remain after the cleaning process may have a thickness of about 10 Å to about 40 Å. In some embodiments, the cleaning process may use a solution or gas containing fluorine (F), and the cleaning process may etch about 14 Å or more of the mask pattern.

In some embodiments, the annealing process may be performed at a temperature sufficient to substantially remove or flow portions of the active region on the opposing sidewalls of the preliminary gate trench to form the gate trench. As such, opposing sidewalls of the gate trench may be substantially defined by portions of the isolation region. Also, a surface of the gate trench extending between the opposing sidewalls thereof may be one of a convex surface and a substantially planar surface. In some embodiments, the annealing process may be performed under a gas atmosphere containing hydrogen at a temperature of about 700 degrees Celsius (° C.) to about 950° C.

In some embodiments, the portions of the mask pattern may be removed to expose a surface of the active region outside the gate trench prior to forming the gate electrode therein. The surface of the active region may be a substantially planar surface extending to the edges of the active region outside the gate trench. Source/drain regions may be formed in the substantially planar surface of the active region after forming the gate electrode in the gate trench, and electrical contacts may be formed on the substantially planar surface of the active region including the source/drain region therein.

In some embodiments, etching the exposed portion of the active region to define the preliminary gate trench may include performing a first etching process on the exposed portion of the active region to form a preliminary upper gate trench, forming oxide layer spacers on opposing sidewalls of the preliminary upper gate trench, and performing a second etching process on the preliminary upper gate trench using the oxide layer spacer as an etch mask to form a preliminary lower gate trench. The preliminary lower gate trench may have a greater width than the preliminary upper gate trench. The cleaning process may substantially remove the oxide layer spacers from the opposing sidewalls of the preliminary upper gate trench, and the annealing process may rounds a boundary or junction between the preliminary upper and lower gate trenches.

According to further embodiments, a method of fabricating a semiconductor device includes forming an isolation region defining an active region in a semiconductor substrate. A mask pattern having an opening crossing the active region is formed. Here, the mask pattern includes an insulating oxide layer. The active region exposed by the opening is etched to form a preliminary gate trench. Here, semiconductor walls remain on sidewalls of the preliminary gate trench, which are in contact with the isolation region and face each other. A cleaning process is performed on the semiconductor substrate having the preliminary gate trench. The mask pattern remains at a thickness of about 1 Å or more on the active region after the cleaning process. An annealing process is performed on the semiconductor substrate on which the cleaning process is performed, so that the semiconductor walls are removed while a gate trench is formed. The remaining mask pattern is removed. A gate dielectric layer is formed on the semiconductor substrate having the gate trench. A gate electrode filling the gate trench is formed on the gate dielectric layer.

In some embodiments, the insulating oxide layer may be formed of a silicon oxide layer.

In some embodiments, the cleaning process may be performed using a solution or gas containing fluorine (F).

In some embodiments, the mask pattern may be formed of a silicon oxide layer and a carbon layer, which are sequentially stacked, and the carbon layer may be removed after forming the preliminary gate trench.

In some embodiments, the annealing process may be performed under a gas atmosphere containing hydrogen.

In some embodiments, the cleaning process may be performed using a solution or gas that etches about 14 Å or more of an oxide layer.

In some embodiments, the cleaning process may be performed using a solution or gas that etches about 20 Å or more of an oxide layer.

In some embodiments, the mask pattern may remain at a thickness of about 10 Å to 40 Å after the cleaning process.

In some embodiments, a bottom region of the gate trench may have a center that protrudes more than edges in contact with the isolation region after the semiconductor walls are removed.

In some embodiments, the bottom region of the gate trench defined between the sidewalls of the gate trench in contact with the isolation region may be formed in a substantially planar shape.

In some embodiments, forming the preliminary gate trench may include etching the active region exposed by the opening, and forming a preliminary upper gate trench, forming an oxide layer spacer on a sidewall of the preliminary upper gate trench, and etching the active region of the bottom region of the preliminary upper gate trench using the mask pattern, the isolation region and the oxide layer spacer as etch masks, and forming a preliminary lower gate trench having a greater width than the preliminary upper gate trench. A boundary between the preliminary gate trench and the lower gate trench may be rounded during the annealing process.

BRIEF DESCRIPTION OF DRAWINGS

Example embodiments are described in further detail below with reference to the accompanying drawings. It should be understood that various aspects of the drawings may have been exaggerated for clarity.

DETAILED DESCRIPTION OF EMBODIMENTS

The present inventive concept will now be described more fully hereinafter with reference to the accompanying drawings, in which embodiments of the inventive concept are shown. This inventive concept, however, may be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 1:
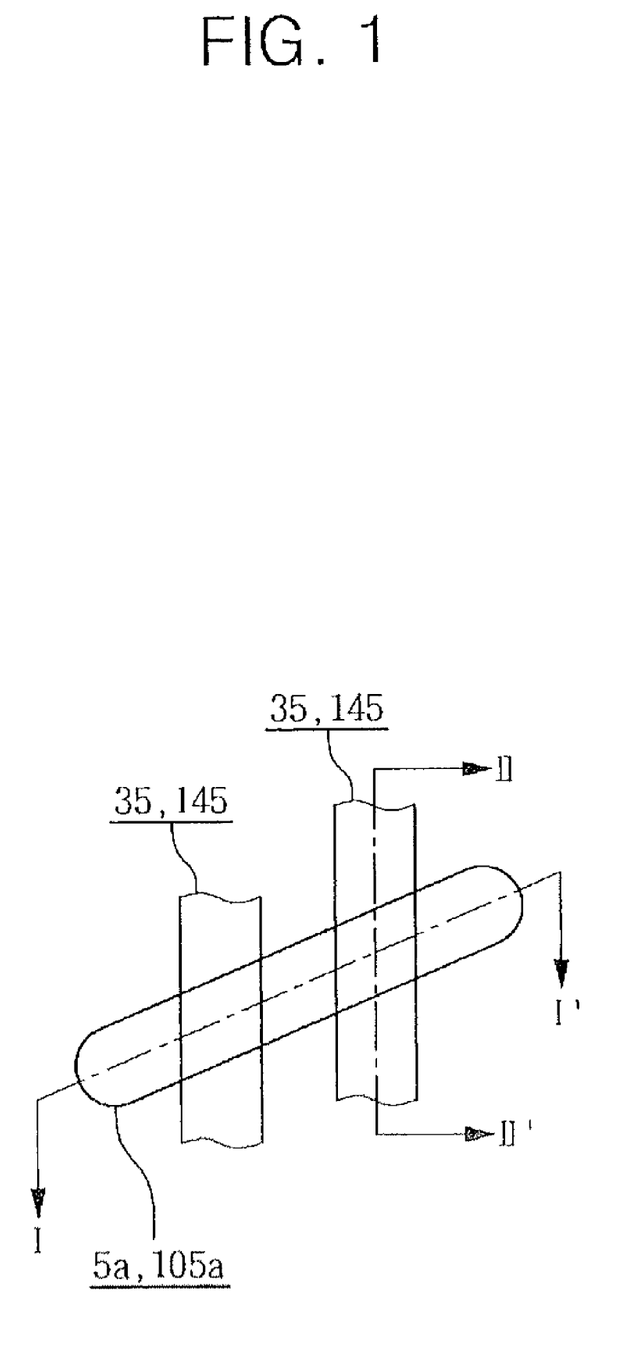
FIG. 1 is a plan view of a semiconductor device according to example embodiments.

FIG. 1 is a plan view of a semiconductor device according to example embodiments, FIGS. 2A to 2E are cross-sectional views illustrating methods of fabricating a semiconductor device according to some example embodiments, and FIGS. 3A to 3E are cross-sectional views illustrating methods of fabricating a semiconductor device according to other example embodiments. In FIGS. 2A to 3E, portions indicated as "A" represent a region taken along line I-I' of FIG. 1, and portions indicated as "B" represent a region taken along line II-II of FIG. 1.

A method of fabricating a semiconductor device according to some example embodiments will now be described with reference to FIGS. 1 and 2A to 2E.

Figure 2A:
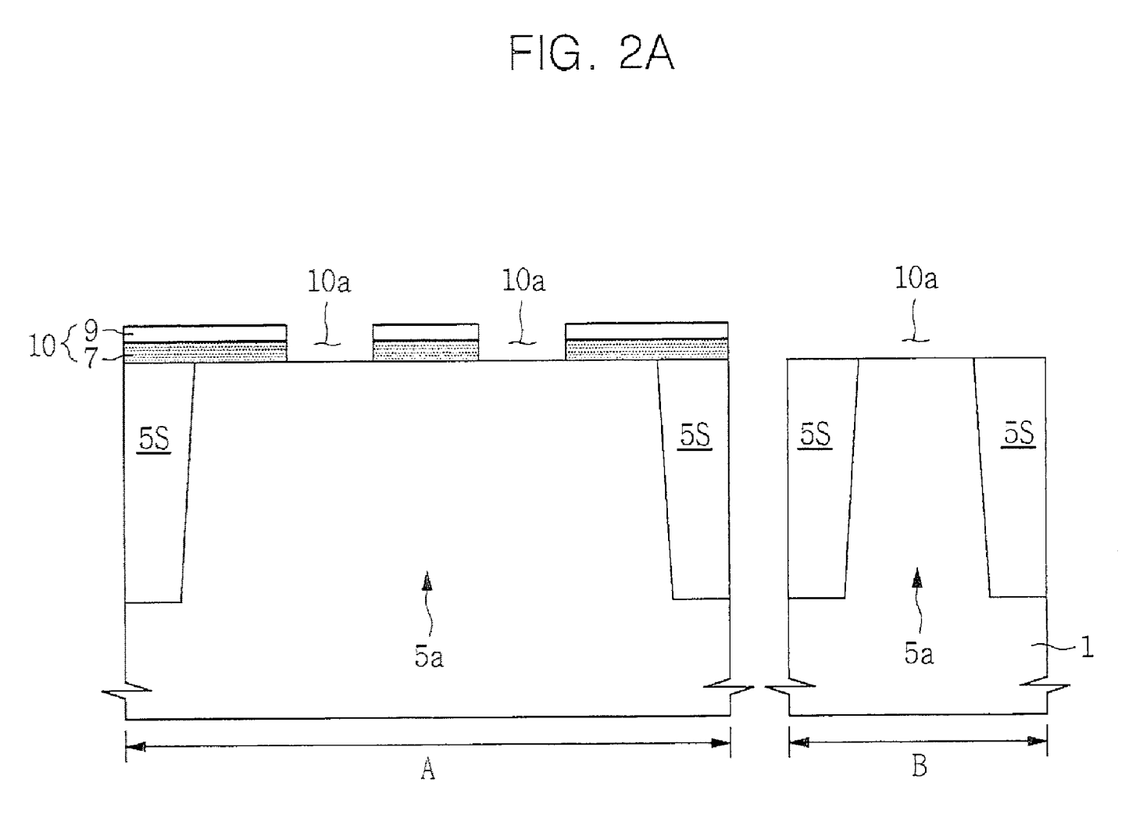
FIGS. 2A to 2E are cross-sectional views illustrating a method of fabricating a semiconductor device according to one example embodiment.

Referring to FIGS. 1 and 2A, a semiconductor substrate 1 is prepared. The semiconductor substrate 1 may be a semiconductor wafer formed of a semiconductor material such as silicon. An isolation region 5s defining an active region 5a is formed in the semiconductor substrate 1. The isolation region 5s may be formed using a shallow trench isolation technique. For example, forming the isolation region 5s may include etching a field region of the semiconductor substrate 1 to form a trench, forming a buffer oxide layer on an inner wall of the trench, forming an insulating liner on the semiconductor substrate having the buffer oxide layer, forming an isolation oxide layer filling an empty space of the trench on the semiconductor substrate having the insulating liner, and planarizing the isolation oxide layer. Here, the buffer oxide layer may be a silicon oxide layer formed by a thermal oxidation method to cure damage to the semiconductor substrate 1 when the trench is formed. The insulating liner may be formed of a material having excellent oxidation resistant characteristics, and the isolation oxide layer may be formed of a material having excellent gap filling and insulating characteristics and having an etch selectivity with respect to the semiconductor substrate 1.

A mask pattern 10 having an opening 10a crossing the active region 5a is formed on the semiconductor substrate 1 having the isolation region 5s. As illustrated in FIG. 2A, the opening 10a may be formed as a trench or line crossing the active region 5a and extending toward the isolation region 5s. Alternatively, the opening 10a may be formed as an "island-"crossing the active region 5a and not extending toward the isolation region 5s.

The mask pattern 10 includes an insulating oxide mask 7. The oxide mask 7 may be formed to a thickness of about 15 Å to about 200 Å. The oxide mask 7 may be formed of a silicon oxide layer. For example, the oxide mask 7 may be formed of a medium temperature oxide (MTO) layer.

The mask pattern 10 includes the oxide mask 7 and a carbon layer 9, which are sequentially stacked. The carbon layer 9 has an amorphous structure.

In the field of photolithography, an anti-reflection layer (ARL) may be used in a photolithography process. Therefore, while an ARL is not illustrated in the present example embodiment, an ARL may be used to form the mask pattern 10.

In the present example embodiment, one or more openings 10a crossing the active region 5a are formed. That is, the number of the openings 10a may be determined depending on the number of transistors to be formed in the active region 5a. For example, when two transistors are formed in the active region 5a to constitute a device, two openings 10a crossing the active region 5a and spaced apart from each other may be formed.

Figure 2B:
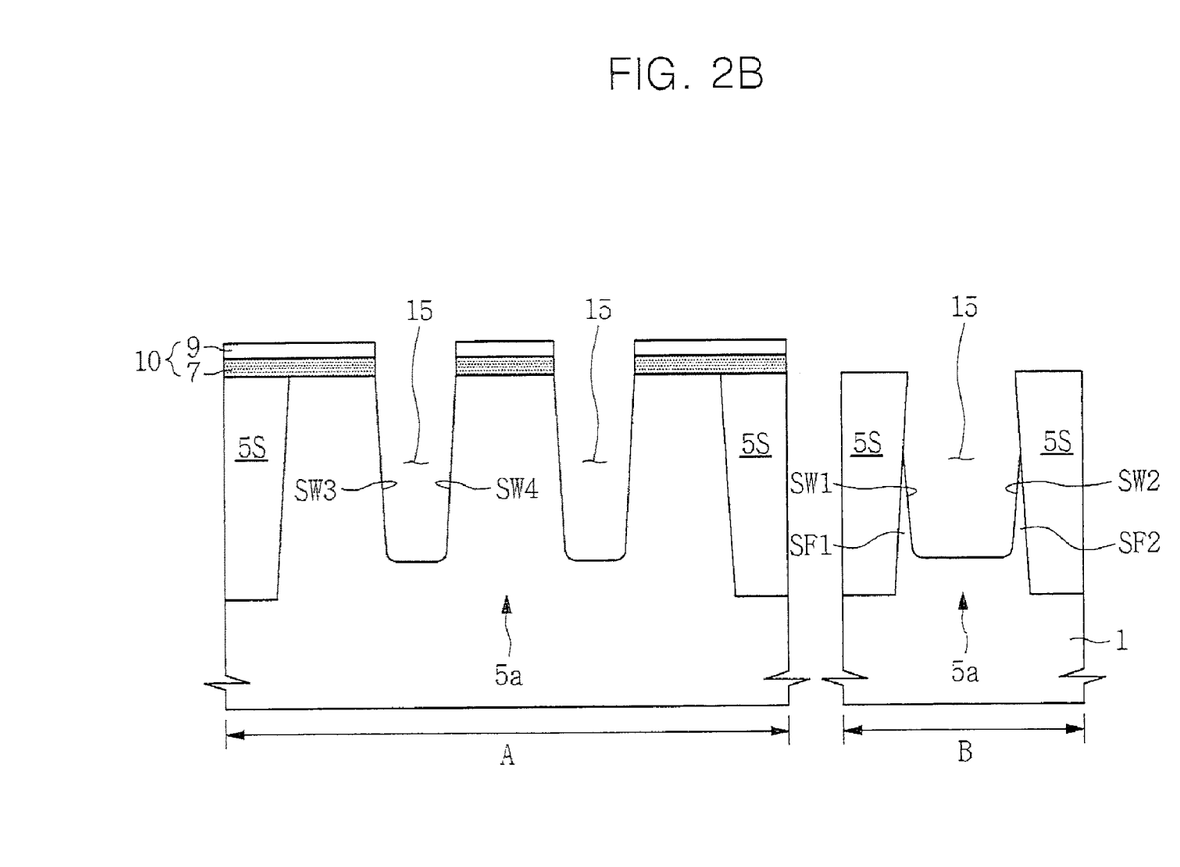

Referring to FIGS. 1 and 2B, the active region 5a is etched using the mask pattern 10 and the isolation region 5s as etch masks to form a preliminary gate trench 15. The preliminary gate trench 15 may include first and second sidewalls SW1 and SW2 in contact with and partially defined by the isolation region 5s and facing each other, and third and fourth sidewalls SW3 and SW4 defined by the active region 5a and facing each other. Here, semiconductor walls SF1 and SF2 may define portions of the first and second sidewalls SW1 and SW2 as well. When the active region 5a is formed of silicon, the semiconductor walls SF1 and SF2 may be silicon walls or silicon residues.

Current-voltage characteristics of a recessed channel MOS transistor may be determined depending on the length, width and depth of the preliminary gate trench 15. Also, as the length of the preliminary gate trench 15, increases, an effective channel length of the transistor is lengthened. The lengthened effective channel length may inhibit short channel effects. Meanwhile, when the semiconductor walls SF1 and SF2 partially define the first and second sidewalls SW1 and SW2 of the preliminary gate trench 15, a channel of a transistor may be formed in the semiconductor walls SF1 and SF2 as well. As described above, when the channel is formed along both a lower portion of the preliminary gate trench and the semiconductor walls SF1 and SF2 that are shorter paths, the effective channel length of a MOS transistor may be reduced.

Figure 2C:
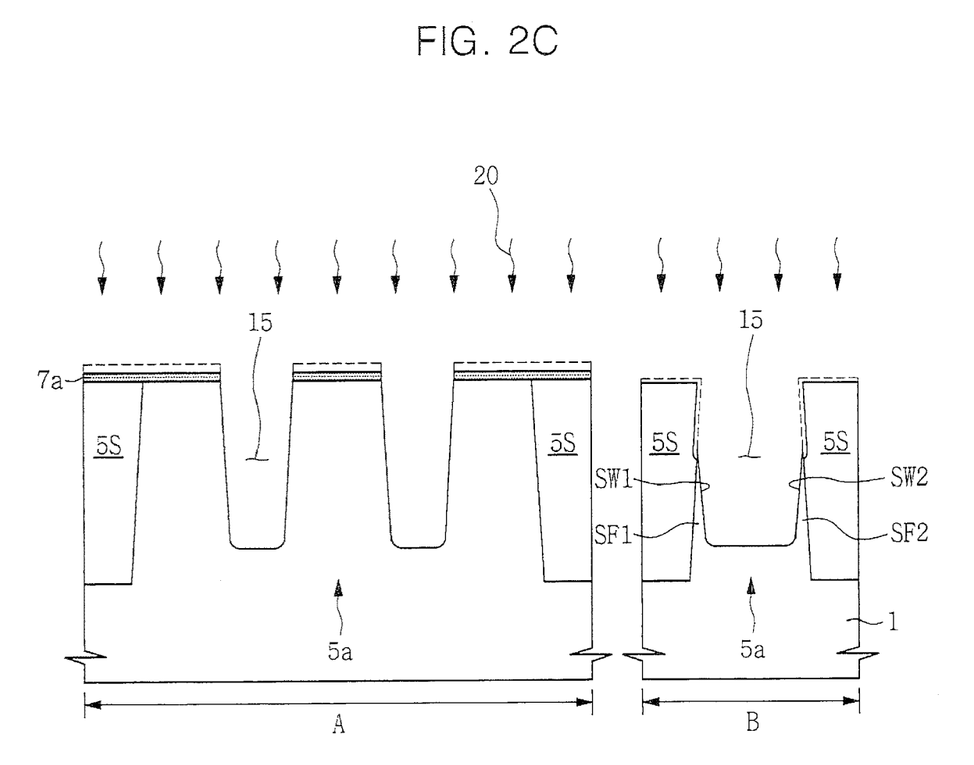

Referring to FIGS. 1 and 2C, when the mask pattern 10 includes the carbon layer 9, the carbon layer 9 may be removed. For example, the carbon layer 9 may be removed using an ashing process. Therefore, the oxide mask 7 may be exposed.

A cleaning process 20 may be performed on the semiconductor substrate from which the carbon layer 9 is removed. In the present example embodiment, the cleaning process 20 includes not only a process for cleaning, but also a process for etching an oxide. That is, the cleaning process 20 may be performed using a solution or gas capable of cleaning an inner wall of the preliminary gate trench 15 and etching an oxide layer. The cleaning process 20 may be performed using an etching solution or gas containing fluorine (F). For example, the cleaning process 20 may be performed using a solution containing hydrofluoric acid (HF). As a result, the thickness of the oxide mask 7 may be reduced and a part of the exposed portion of the isolation region 5s may be etched. Here, a reference mark of the oxide mask whose thickness is reduced, i.e., a remaining mask pattern, is defined as 7a. The remaining mask pattern 7a may be formed to a thickness of about 1 Å to about 200 Å. More preferably, the remaining mask pattern 7a may be formed to a thickness of about 10 Å to about 40 Å.

When the remaining mask pattern 7a is too thick, it may be difficult to control a process of removing the remaining mask pattern 7a in subsequent processing. This is because the remaining mask pattern 7a is formed on the isolation region 5s as well as on the active region 5a. Thus, as the remaining mask pattern 7a becomes thicker, an oxide layer of the isolation region 5s may be over-etched during etching of the remaining mask pattern 7a. In particular, the portions of the isolation region 5s that define the sidewalls SW1 and SW2 of the gate trench 15 may be excessively etched, so that electrical short-circuiting or interruption can be generated between gate electrodes formed in the adjacent gate trenches 15. Therefore, the remaining mask pattern 7a (also shown as 107a of FIG. 3D) may be formed to a thickness of about 40 Å or smaller.

The cleaning process 20 may be performed to etch about 14 Å or more of a silicon oxide layer. More preferably, it may be performed to etch about 20 Å or more of the silicon oxide layer. Here, the silicon oxide layer may be a thermal oxide layer. The cleaning process 20 may be performed taking into account the thickness of the remaining mask pattern 7a. For example, the cleaning process 20 may be performed under the conditions that the remaining mask pattern 7a may remain at a thickness of about 1 Å or more, and more preferably, about 10 Å or more, and about 15 Å or more of the silicon oxide layer may be etched, and more preferably, about 20 Å or more. In addition, the silicon oxide layer may not be excessively etched by the cleaning process 20 to prevent the width of the remaining mask pattern 7a from being excessively narrowed. The cleaning process 20 may be performed using a solution or gas capable of etching about 14 Å or more of the silicon oxide layer, and more preferably, about 20 Å or more.

The size or volume of each element is illustrated in the drawings for clarity, and is not intended to limit absolute or relative measurements. That is, the size or volume of each element may be optimized through various experiments. In particular, the reduced volume of the remaining mask pattern 7a whose thickness is reduced and the reduced volume of the isolation region 5s as a result of the cleaning process 20 are exaggerated for clarity, and are not intended to limit absolute or relative measurements. For example, when the remaining mask pattern 7a has a greater etch resistance than the oxide layer forming the isolation region 5s, there may be an etch rate difference between the remaining mask pattern 7a and the isolation region 5s. The dotted line shown in FIG. 2C represents a volume corresponding to a part of each of the mask pattern (7 of FIG. 2B) and the isolation region (5s) being etched during the cleaning process 20.

Figure 2D:
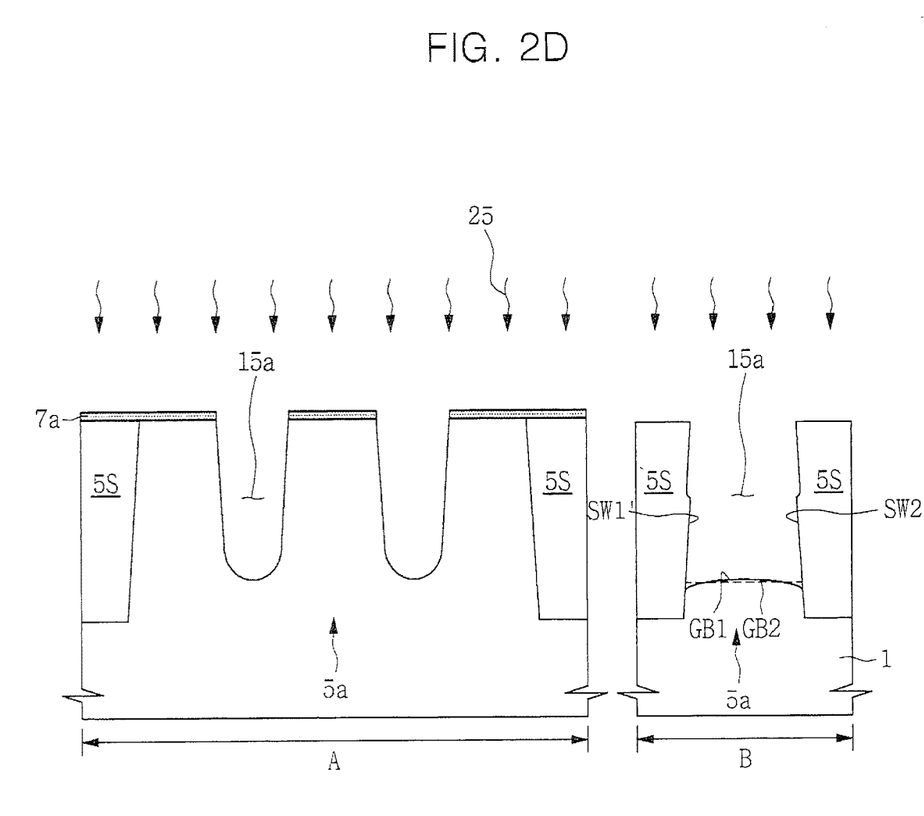

Referring to FIGS. 1 and 2D, an annealing process 25 may be performed on the formed result, and the semiconductor walls (SF1 and SF2 of FIG. 2C) may be flowed to form a gate trench 15a such that the semiconductor walls (SF1 and SF2 of FIG. 2C) are removed and/or no longer define sidewalls thereof. The annealing process 25 may be performed under a gas atmosphere containing hydrogen. Also, the annealing process 25 may be performed at a temperature of about 700° C. to about 950° C. More preferably, the annealing process 25 may be performed at a temperature of about 750° C. to about 950° C. The gate trench 15a may have a first sidewall SW1' and a second sidewall SW2', which are defined by the isolation region 5s and face each other.

The remaining mask pattern 7a may substantially prevent a top surface of the active region 5a in contact with the remaining mask pattern 7a from being rounded by the annealing process 25. That is, the remaining mask pattern 7a may substantially prevent an upper width of the gate trench 15a from being significantly widened by the annealing process 25. Therefore, the remaining mask pattern 7a may enable the top surface of the active region 5a in contact with the remaining mask pattern 7a to be substantially planar, and thus, source/drain contacts as described below may be stably formed.

In some example embodiments, the gate trench 15a may have a bottom region or surface GB1, the center of which is a convex shape, between the first and second sidewalls SW1' and SW2'. That is, as compared to edges of the bottom surface of the gate trench 15a in contact with the isolation region 5s, the center of the bottom surface GB1 of the gate trench 15a may be formed to protrude.

In other example embodiments, a bottom region GB2 of the gate trench 15a defined between the first and second sidewalls SW1' and SW2' may have a substantially planar shape.

The gate trench 15a having the bottom region GB1, the center of which protrudes more than the edges in contact with the isolation region 5s, will be mainly described below. However, methods described below may be equivalently applicable to a gate trench 15a having the bottom region GB2 (shown as a dotted line) formed in a substantially planar shape between the first and second sidewalls SW1' and SW2'.

Figure 2E:
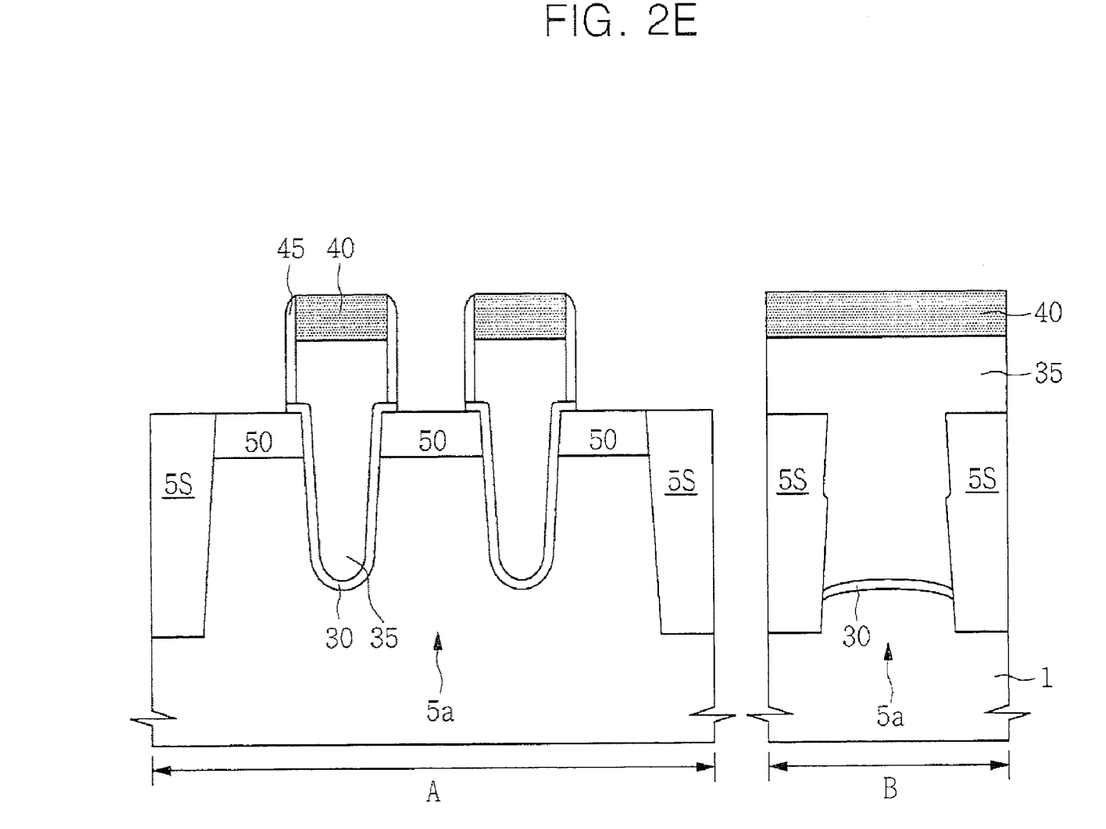

Referring to FIGS. 1 and 2E, the remaining mask pattern 7a may be removed. Afterwards, a gate dielectric layer 30 may be formed on the semiconductor substrate having the gate trench 15a. The gate dielectric layer 30 may be formed of a silicon oxide layer and/or a high-k dielectric layer. The high-k dielectric layer may be defined as a dielectric material having a higher dielectric constant than the silicon oxide layer.

A gate electrode 35 filling the gate trench 15a may be formed on the gate dielectric layer 30. The gate electrode 35 may be formed of at least one of a polysilicon layer, a metal layer, a metal nitride layer and a metal-semiconductor compound layer. Forming the gate electrode 35 may include forming a planarized conductive layer and a gate mask 40 on the semiconductor substrate having the gate dielectric layer 30, and etching the planarized conductive layer using the gate mask 40 as an etch mask.

A gate spacer 45 may be formed on a sidewall of an exposed portion of the gate electrode 35 and a sidewall of the gate mask 40. The gate spacer 45 may be formed of at least one of a silicon oxide layer, a silicon nitride layer and a silicon oxynitride layer (SiON layer). Source/drain regions 50 may be formed in the active region 5a at opposite sides of the gate electrode 35.

Next, methods of fabricating a semiconductor device according to other example embodiments will be described below with reference to FIGS. 1 and 3A to 3E.

Figure 3A:
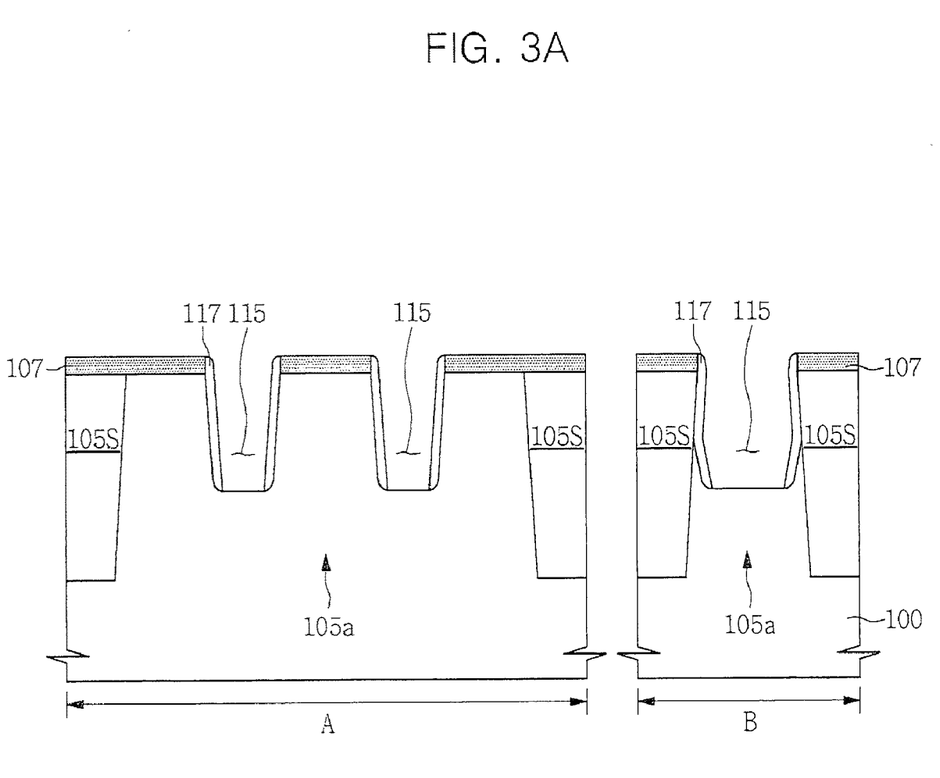
FIGS. 3A to 3E are cross-sectional views illustrating a method of fabricating a semiconductor device according to another example embodiment.

Referring to FIGS. 1 and 3A, a semiconductor substrate 100 is prepared. The semiconductor substrate 100 may be a semiconductor wafer formed of a semiconductor material such as silicon. An isolation region 105s defining an active region 105a may be formed in the semiconductor substrate 100. The isolation region 105s may be formed using a shallow trench isolation technique as illustrated in FIG. 2A. A mask pattern 107 having an opening crossing the active region 105a is formed on the semiconductor substrate 100 having the isolation region 105s. As illustrated in FIG. 2A, the opening of the mask pattern 107 may be formed as a trench or line type crossing the active region 105a and extending toward the isolation region 105s, or as illustrated in FIG. 3A, it may be formed as an island type crossing the active region 105a and not extending toward the isolation region 105s. As illustrated in FIG. 2A, the mask pattern 107 may be formed of an oxide mask and a carbon mask, which are sequentially stacked.

The active region 105a is etched using the mask pattern 107 and the isolation region 105s as etch masks to form a preliminary upper gate trench 115. When the mask pattern 107 includes a carbon layer, the carbon layer may be removed.

A spacer 117 may be formed on a sidewall of the preliminary upper gate trench 115. The spacer 117 may be formed of a silicon oxide layer. For example, the spacer 117 may be formed of a MTO layer.

Figure 3B:
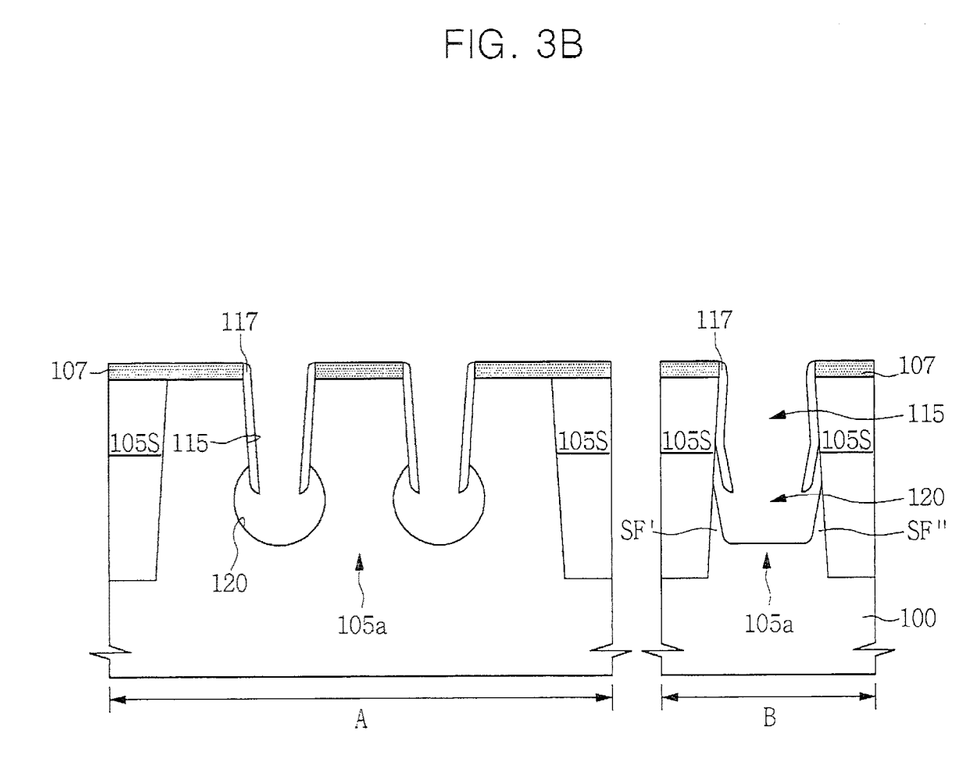

Referring to FIGS. 1 and 3B, the active region 105a is etched using the mask pattern 107 and the spacer 117 as etch masks, so that a preliminary lower gate trench 120 having a greater width than the preliminary upper gate trench 115 is formed. Forming the preliminary lower gate trench 120 may include performing an isotropic etching process using the mask pattern 107 and the spacer 117 as etch masks to etch the active region 105a.

Semiconductor walls SF' and SF" may remain on sidewalls of the preliminary lower gate trench 120, which are in contact with the isolation region 105s and face each other. When the active region 105a is formed of silicon, the semiconductor walls SF' and SF" may be silicon walls or silicon residues.

Figure 3C:
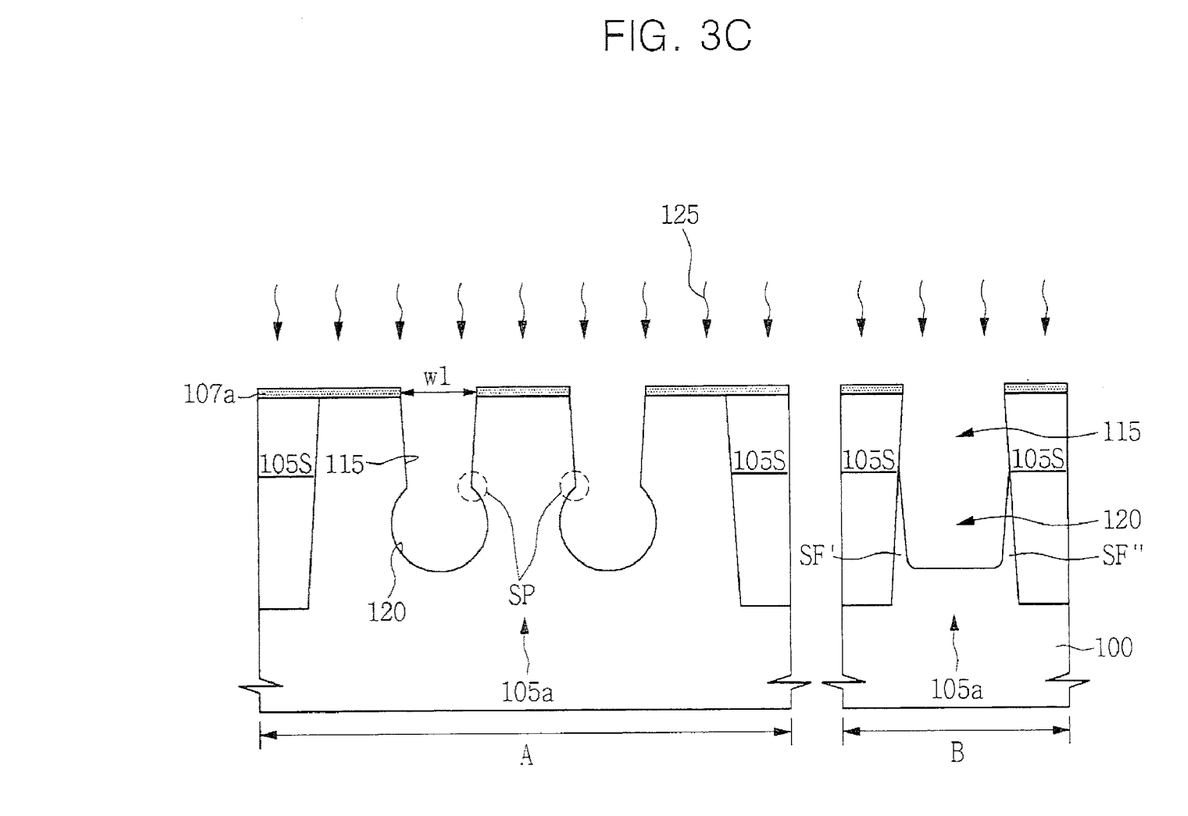

Referring to FIGS. 1 and 3C, a cleaning process 125 substantially similar to the cleaning process 20 of FIG. 2C may be performed on the semiconductor substrate having the preliminary lower gate trench 120. The cleaning process 125 may be performed using a solution or gas capable of etching an oxide layer like the cleaning process 20 of FIG. 2C. That is, the cleaning process 125 may be performed using an etching solution or gas containing fluorine (F). Therefore, the thickness of the oxide mask 107 may be reduced, a part of the exposed portion of the isolation region 105s may be etched, and the spacer 117 may be etched. A remaining portion of the mask pattern 107, with its thickness reduced, may be defined as a remaining mask pattern 107a. Further, the remaining mask pattern 107a may be the same as the remaining mask pattern 7a described with reference to FIG. 2C in some embodiments. Therefore, further description of the remaining mask pattern 107a will be omitted.

Meanwhile, a relatively sharp portion SP may be formed at a boundary between the preliminary upper gate trench 115 and the preliminary lower gate trench 120. Also, after etching of the spacer 117, opposing sidewalls of the preliminary upper gate trench 115 may be partially defined by the isolation region 105s.

Figure 3D:
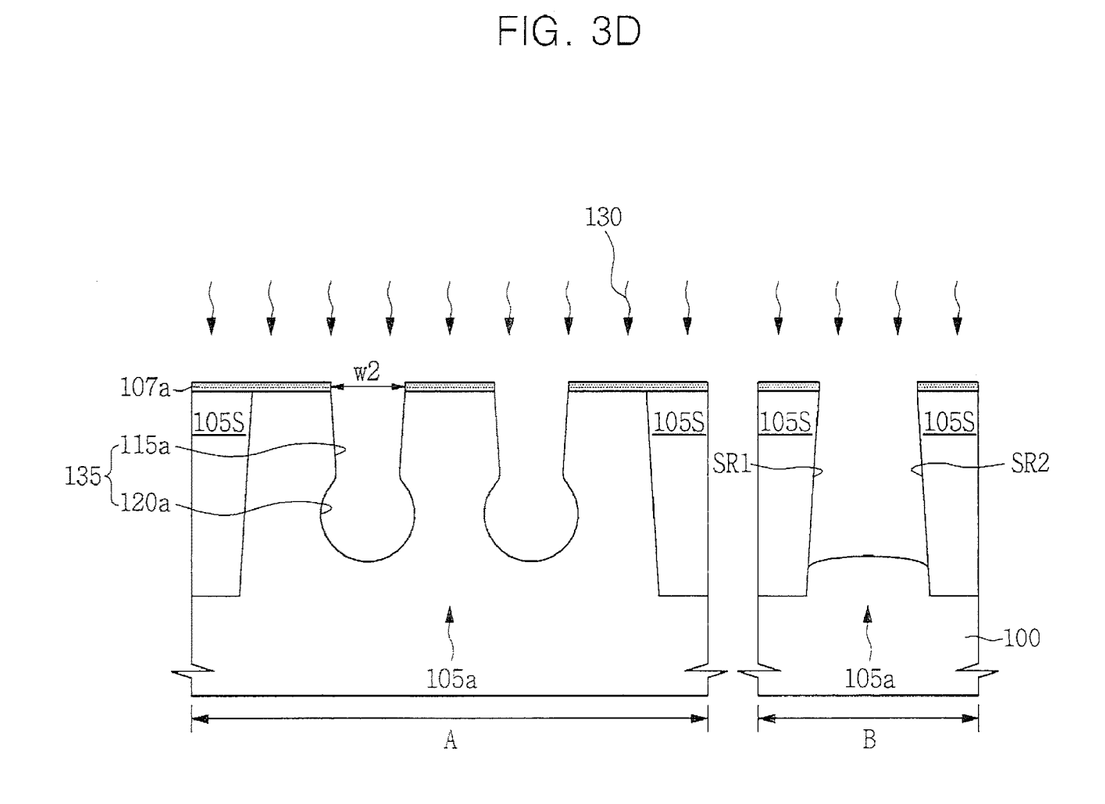

Referring to FIGS. 1 and 3D, an annealing process 130 may be performed on the resulting structure on which the cleaning process (125 of FIG. 3C) has been performed to substantially round the sharp portion SP at the boundary between the preliminary lower gate trench (120 of FIG. 3C) and the preliminary upper gate trench (115 of FIG. 3C), and to flow the semiconductor walls (SF' and SF" of FIG. 3C), so that the semiconductor walls (SF' and SF" of FIG. 3C) may be removed. As a result, a gate trench 135 defined by an upper gate trench 115a and a lower gate trench 120a may be formed. The gate trench 135 may have first and second opposing sidewalls SR1 and SR2 defined by the isolation region 105s and facing each other.

In some example embodiments, the gate trench 135 may have a bottom surface or region, the center of which defines a convex shape, between the first and second sidewalls SR1 and SR2. That is, as compared to edges of the bottom surface of the gate trench 135 in contact with the isolation region 105s, the center of the bottom surface of the gate trench 135 may be formed to protrude.

In other example embodiments, the bottom region of the gate trench 135 defined between the first and second sidewalls SR1 and SR2 may have a substantially planar shape.

Meanwhile, the remaining mask pattern 107a may substantially prevent an upper width W2 of the gate trench 115a from being significantly greater than an upper width W1 of the preliminary upper gate trench (115 of FIG. 3C) after the annealing process 130. In other words, the upper width W2 of the gate trench 115a and the upper width W1 of the preliminary upper gate trench 115 may be substantially similar, where W1 and W2 are defined between the edges of the active region 105a including the remaining mask pattern 107a thereon. Also, the remaining mask pattern 107a may substantially prevent a top surface of the active region 105a in contact with the remaining mask pattern 107a from being rounded by the annealing process 130. Therefore, the remaining mask pattern 107a may enable the top surface of the active region 105a in contact with the remaining mask pattern 107a to be substantially planar, and thus, source/drain contacts as described below may be stably formed.

Figure 3E:
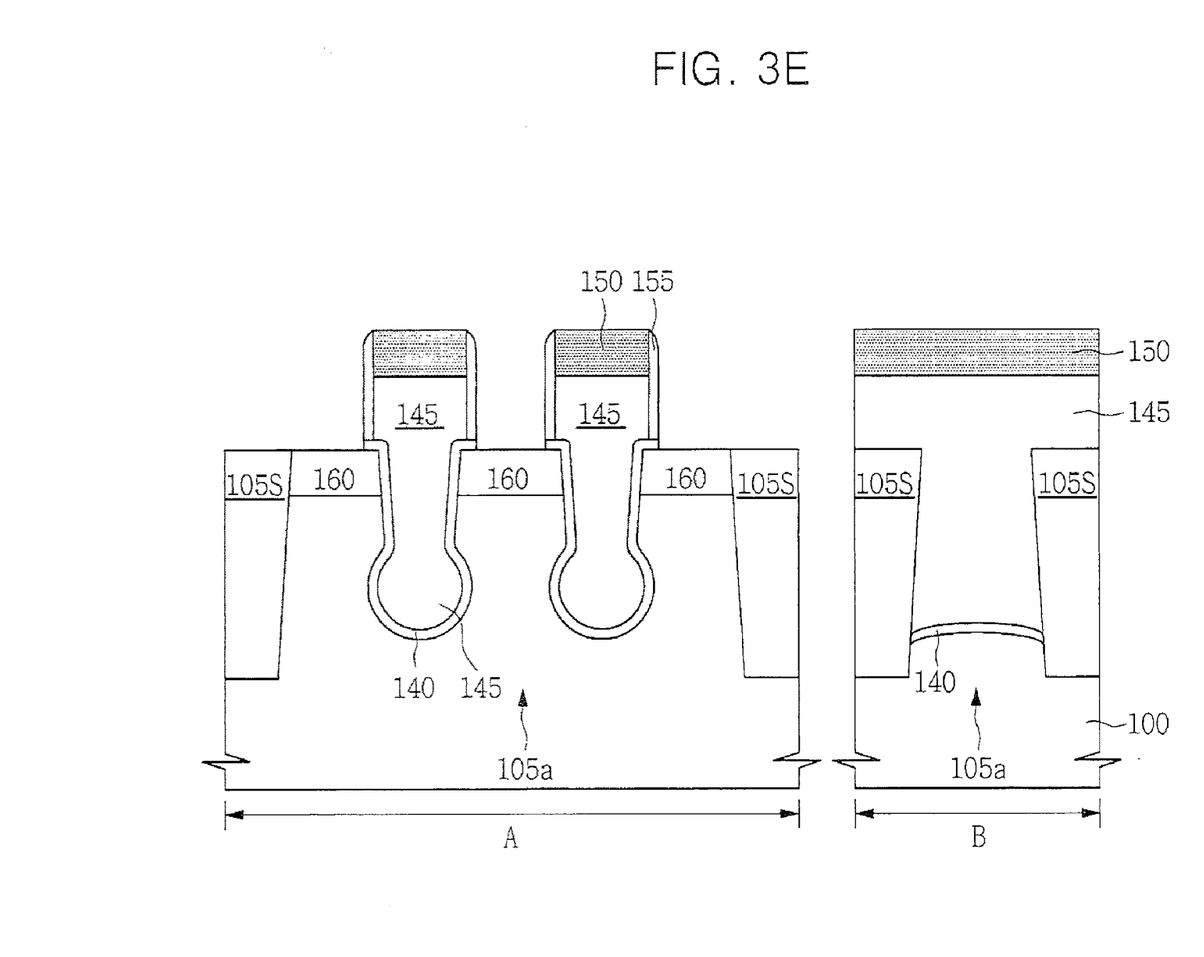

Referring to FIGS. 1 and 3E, the remaining mask pattern (107a of FIG. 3D) may be removed. A gate dielectric layer 140 may be formed on the semiconductor substrate having the gate trench 135. The gate dielectric layer 140 may be formed of a silicon oxide layer and/or a high-k dielectric layer.

A gate electrode 145 filling the gate trench 135 may be formed on the gate dielectric layer 140. Forming the gate electrode 145 may include forming a planarized conductive layer and a gate mask 150 on the semiconductor substrate having the gate dielectric layer 140, and etching the planarized conductive layer using the gate mask 150 as an etch mask.

An insulating gate spacer 155 may be formed on a sidewall of an exposed portion of the gate electrode 145 and on a sidewall of the gate mask 150. Source/drain regions 160 may be formed in the active region 105a at opposite sides of the gate electrode 145. Thus, a recessed channel MOS transistor may be fabricated.

<Experimental Examples>

Experimentally measured results of substrates fabricated according to the methods described with reference to FIGS. 3A to 3D among the above described example embodiments will be described below.

Figure 4:
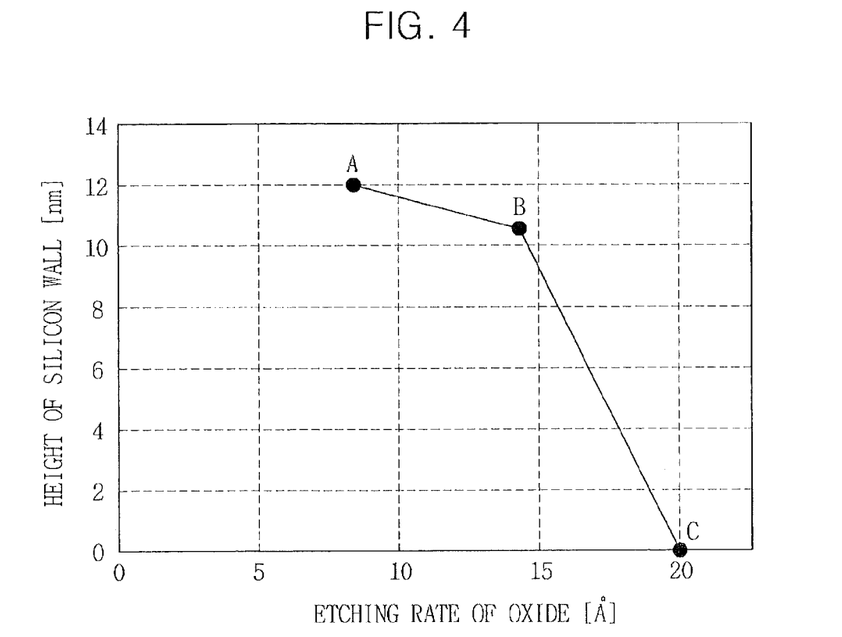
FIG. 4 illustrates a relationship between an etching rate of an oxide during a cleaning process and a silicon wall after an annealing process.

FIG. 4 illustrates an etching rate of an oxide during the cleaning process 125 of FIG. 3C, and a change in height of the semiconductor walls, i.e., silicon walls (SF' and SF" of FIG. 3C), after the annealing process 130 of FIG. 3D. The height of each of the silicon walls SF' and SF" may be defined as a distance from a center of a bottom surface of the preliminary lower gate trench 120 to an end of each of the silicon walls SF' and SF" toward a top surface of the active region 105a. In FIG. 4, an etching rate of an oxide according to the cleaning process (125 of FIG. 3C) is plotted on the horizontal axis, and the height of each of the remaining silicon walls (SF' and SF" of FIG. 3C) after the annealing process (130 of FIG. 3D) is performed under the same conditions is plotted on the vertical axis.

As shown in FIG. 4, semiconductor substrates were prepared on which a first cleaning process "A" capable of etching about 8 Å of a thermal oxide layer formed on a silicon substrate was performed, a second cleaning process "B" capable of etching about 14 Å of the thermal oxide layer was performed, and a third cleaning process "C" capable of etching about 20 Å of the thermal oxide layer was performed as the cleaning process (125 of FIG. 3C), respectively. The first to third processes A, B, and C commonly used a hydrofluoric acid solution diluted with water at a ratio of about 30 (HF):1 ($H_2O$). The annealing process (130 of FIG. 3D) was performed on the semiconductor substrates on which the first to third cleaning processes A, B, and C were performed, respectively. The annealing process (130 of FIG. 3D) was performed under the same conditions. In particular, the annealing process (130 of FIG. 3D) was performed under hydrogen atmosphere at a temperature of about 770° C.

Referring to FIG. 4, when the first cleaning process A was performed as the cleaning process (125 of FIG. 3C), the semiconductor walls of FIG. 3C, i.e., the silicon walls SF' and SF", remained at a height of about 12 nm, when the second cleaning process B was performed, the silicon walls SF' and SF" of FIG. 3C remained at a height of about 10.5 nm, and when the third cleaning process C was performed, all of the silicon walls SF' and SF" of FIG. 3C were removed.

Figure 5:
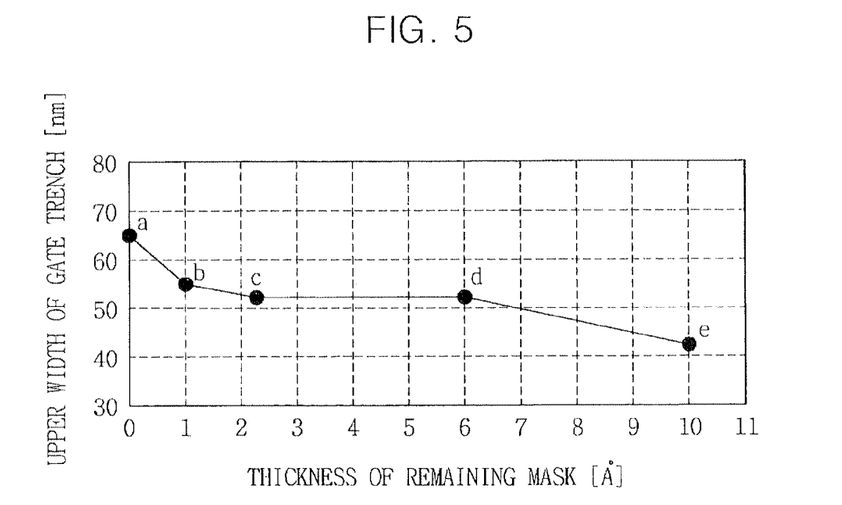
FIG. 5 illustrates a relationship between a thickness of a remaining mask pattern and an upper width of a gate trench according to a cleaning process.

FIG. 5 illustrates a relationship between the thickness of the remaining mask pattern (107a of FIG. 3C) in response to the cleaning process (125 of FIG. 3C) and the upper width W2 of the upper gate trench (115 of FIG. 3D) in response to the annealing process (130 of FIG. 3D). In FIG. 5, the thickness of the remaining mask pattern 107a according to changes in condition of the cleaning process (125 of FIG. 3C) is plotted on the horizontal axis, and the upper width W2 of the upper gate trench (115a of FIG. 3D) after performing H2 annealing at a temperature of about 770° C. as the annealing process (130 of FIG. 3D) is plotted on the vertical axis.

First, for purposes of experimentation, substrates including the remaining mask patterns 107 at thicknesses of about 0 Å, about 1 Å, about 2.3 Å, about 6 Å, and about 10 Å, were prepared by performing a process of fabricating a semiconductor device described with reference to FIGS. 3A to 3C, including the cleaning process 125 of FIG. 3C. The annealing process 130 of FIG. 3D was performed on the prepared substrates under hydrogen atmosphere at a temperature of about 770° C., and the upper width W2 of the upper gate trench 115a was measured.

Referring to FIG. 5, when an annealing process was performed on a substrate including a remaining mask pattern "a" having a thickness of about 0 Å, the upper width of the upper gate trench 115a was about 65 nm; when the annealing process was performed on a substrate including a mask pattern "b" having a thickness of about 1 Å, the upper width of the upper gate trench 115a was about 55 nm; when the annealing process was performed on a substrate including a mask pattern "c" having a thickness of about 2.3 Å, the upper width of the upper gate trench 115a was about 52 nm; when the annealing process was performed on a substrate including a mask pattern "d", having a thickness of about 6 Å, the upper width of the upper gate trench 115a was about 52 nm; and when the annealing process was performed on a substrate including a mask pattern "e" having thickness of about 10 Å, the upper width of the upper gate trench 115a was about 42 nm.

First, when comparing a case in which the mask pattern 107a does not remain (e.g. where the mask pattern 107a is substantially removed) after the cleaning 125 of FIG. 3C with a case in which the mask pattern 107a remains, it is observed that the case in which the mask pattern 107a does not remain results in a trench having a greater upper width W2 than the case in which the mask pattern 107a remains. That is, as the upper width of the upper gate trench 115a increases, a top surface of the active region 105a defined between the upper gate trenches 115a becomes narrower. As the top surface of the active region 105a between the gate trenches 115a becomes narrower, it is more difficult to stably and reliably form a contact electrically connected to the source/drain region 160 of a MOS transistor of FIG. 3E. Therefore, it may be desirable for at least a portion of the mask pattern 107a to remain after the cleaning process 125.

Meanwhile, when the mask pattern 107a remains at thicknesses of about 2.3 Å and 6 Å, the upper width W2 of the upper gate trench 115a is about the same in both cases. Further, when the mask pattern 107a remains at a thickness of about 10 Å, the upper width W2 of the upper gate trench 115a is substantially the same as an upper width of a desired target. Therefore, it may be observed from FIG. 5 that when the remaining mask pattern 107a remains at a minimum thickness of about 1 Å, the upper width of the upper gate trench is not substantially or excessively broadened, and when it remains at a minimum thickness of about 10 Å, an upper gate trench having a desired upper width may be formed.

Considering the above results, the mask pattern 107a may remain at a thickness of 1 Å or more, and more particularly, about 10 Å or more after the cleaning process 125 is performed, where the cleaning process 125 is capable of etching about 14 Å or more, and more particularly, about 20 Å or more of a thermal oxide layer.

According to example embodiments, a silicon residue, i.e., silicon walls, may be reduced and/or removed from remaining on edges of a gate trench in contact with an isolation region. Also, a stable source/drain contact region can be formed. Therefore, a stable and reliable recessed channel MOS transistor can be formed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, the method comprising:

forming a mask pattern on an active region of a substrate defined by an isolation region, the mask pattern including an opening therein exposing a portion of the active region;

etching the exposed portion of the active region to define a preliminary gate trench therein, wherein portions of the mask pattern extend to edges of the active region outside the preliminary gate trench;

performing an annealing process on the preliminary gate trench and the portions of the mask pattern extending to the edges of the active region outside the preliminary gate trench to form a gate trench from the preliminary gate trench, wherein the gate trench and the preliminary gate trench have a substantially similar width defined between the edges of the active region including the portions of the mask pattern thereon;

prior to performing the annealing process, performing a cleaning process on the substrate including the preliminary gate trench therein, wherein the cleaning process reduces a thickness of the mask pattern without substantially increasing a width of the opening therein to define the portions of the mask pattern extending to the edges of the active region outside the preliminary gate trench, wherein the annealing process is performed at a temperature sufficient to substantially remove portions of the active region on opposing sidewalls of the preliminary gate trench to form the gate trench, wherein opposing sidewalls of the gate trench are substantially defined by portions of the isolation region; and forming a gate electrode in the gate trench.

2. The method of claim 1, wherein a surface of the gate trench extending between the opposing sidewalls thereof comprises one of a convex surface and a substantially planar surface.

3. The method of claim 1, further comprising:

removing the portion of the mask pattern to expose a surface of the active region outside the gate trench prior to forming the gate electrode therein, wherein the surface of the active region comprises a substantially planar surface extending to the edges of the active region;

forming source/drain regions in the substantially planar surface of the active region after forming the gate electrode in the gate trench; and forming electrical contacts on the substantially planar surface of the active region including the source/drain region therein.

4. The method of claim 1, wherein the portions of the mask pattern that remain after the cleaning process have a thickness of about 1 Å or more.

5. The method of claim 4, wherein the portions of the mask pattern that remain after the cleaning process have a thickness of about 10 Å to about 40 Å.

6. The method of claim 1, wherein the cleaning process may include fluorine (F), and wherein the cleaning process is configured to etch about 14 Å or more of the mask pattern.

7. The method of claim 1, wherein etching the exposed portion of the active region to define the preliminary gate trench comprises:

performing a first etching process on the exposed portion of the active region to form a preliminary upper gate trench;

forming an oxide layer spacer on opposing sidewalls of the preliminary upper gate trench; and performing a second etching process on the preliminary upper gate trench using the oxide layer spacer as an etch mask to form a preliminary lower gate trench having a greater width than the preliminary upper gate trench.

8. A method of fabricating a semiconductor device, comprising:

forming an isolation region defining an active region in a semiconductor substrate;

forming a mask pattern having an opening crossing the active region, wherein the mask pattern includes an insulating oxide layer;

etching the active region exposed by the opening, and forming a preliminary gate trench, wherein semiconductor walls remain on sidewalls of the preliminary gate trench, which are in contact with the isolation region and face each other;

performing a cleaning process on the semiconductor substrate having the preliminary gate trench, wherein the mask pattern has a thickness of about 1 Å or more on the active region after the cleaning process;

performing an annealing process on the preliminary gate trench and on portions of the mask pattern that extend to edges of the active region outside the preliminary gate trench, and removing the semiconductor walls while a gate trench is formed, wherein opposing sidewalls of the gate trench are substantially defined by portions of the isolation region;

removing the remaining mask pattern;

forming a gate dielectric layer on the semiconductor substrate having the gate trench; and forming a gate electrode filling the gate trench on the gate dielectric layer.

9. The method of claim 8, wherein the insulating oxide layer is formed of a silicon oxide layer.

10. The method of claim 8, wherein the cleaning process uses a solution or gas containing fluorine (F).

11. The method of claim 8, wherein the mask pattern comprises a silicon oxide layer and a carbon layer, which are sequentially stacked, and further comprising:

removing the carbon layer after formation of the preliminary gate trench in the active region.

12. The method of claim 8, wherein the annealing process is performed under a gas atmosphere containing hydrogen.

13. The method of claim 8, wherein the cleaning process uses a solution or gas that etches about 14 Å or more of an oxide layer.

14. The method of claim 8, wherein the cleaning process uses a solution or gas that etches about 20 Å or more of an oxide layer.

15. The method of claim 8, wherein the mask pattern remains at a thickness of about 10 Å to 40 Å after the cleaning process.

16. The method of claim 8, wherein a bottom region of the gate trench has a center that protrudes more than edges in contact with the isolation region after the semiconductor walls are removed.

17. The method of claim 8, wherein a bottom region of the gate trench defined between the sidewalls of the gate trench in contact with the isolation region is formed in a substantially planar shape.

18. The method of claim 8, wherein forming the preliminary gate trench comprises:

etching the active region exposed by the opening, and forming a preliminary upper gate trench;

forming an oxide layer spacer on a sidewall of the preliminary upper gate trench; and etching the active region of a bottom region of the preliminary upper gate trench using the mask pattern, the isolation region and the oxide layer spacer as etch masks, and forming a preliminary lower gate trench having a greater width than the preliminary upper gate trench, wherein a boundary between the preliminary gate trench and the lower gate trench is rounded during the annealing process.

* * * * *